United States Patent [19]
Arendt et al.

[11] Patent Number: 4,551,844
[45] Date of Patent: Nov. 5, 1985

[54] DEMODULATION OF VAPOR DENSITY

[75] Inventors: Paul N. Arendt, Los Alamos, N. Mex.; Vance I. Valencia, San Diego, Calif.

[73] Assignee: Jersey Nuclear-Avco Isotopes, Inc., Bellevue, Wash.

[21] Appl. No.: 482,184

[22] Filed: Apr. 5, 1983

[51] Int. Cl.$^4$ .............................................. H01J 27/00
[52] U.S. Cl. .................................... 373/12; 250/423 P
[58] Field of Search ..................................... 373/10–16; 250/423, 396 R, 396 ML, 397, 398, 492.1, 492.2, 492.3, 423 P

[56] References Cited
U.S. PATENT DOCUMENTS 3,202,794  8/1965  Shrader ............................. 373/13 X
3,244,855  4/1966  Cauley .............................. 373/12 X
3,544,913  12/1970 Anderson ........................ 373/12 X Primary Examiner—Roy N. Envall, Jr.
Attorney, Agent, or Firm—Weingarten, Schurgin, Gagnebin & Hayes

[57] ABSTRACT

In an electron beam evaporation system utilizing a grid to control electron flow, non-uniformities in vapor density caused by periodic trapping of electrons near the filament due to the magnetic field produced by alternating heater current are substantially reduced either (1) by out-of-phase grid modulation which increases electron flow from the filament at times when the alternating magnetic field operates to trap electrons, (2) by using a high frequency a.c. source for heating the filament thereby to smooth out the effects of the a.c.-produced magnetic field, or (3) by using an auxiliary cathode heated by the bombardment of electrons from a filament spaced from the cathode by a distance which removes the cathode from the magnetic field produced by the a.c. heating of the filament. In one emobodiment, demodulation of vapor density is employed in laser isotope separation to provide a temporally uniform atomic uranium vapor.

12 Claims, 7 Drawing Figures

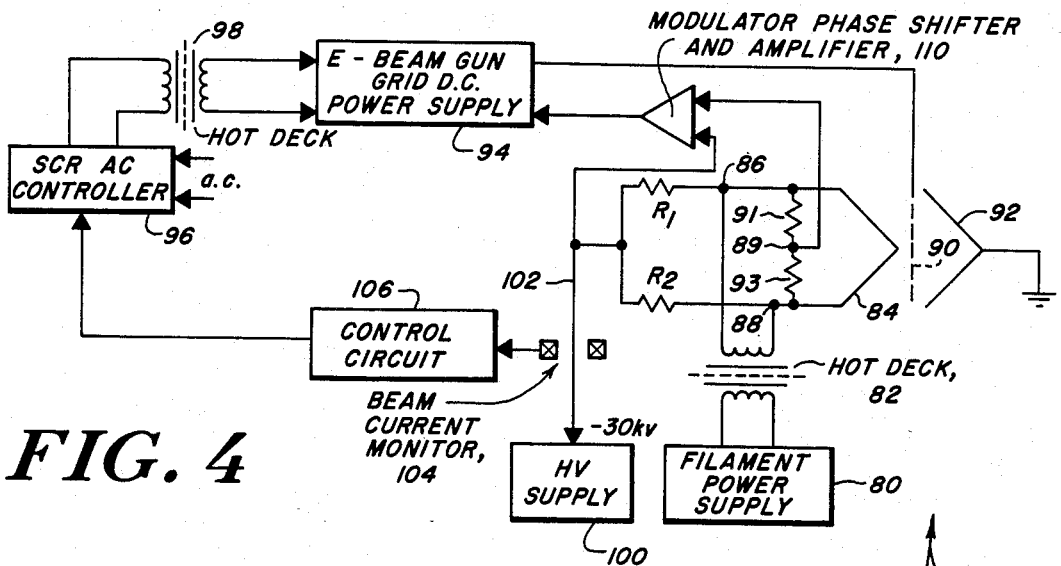
FIG. 4
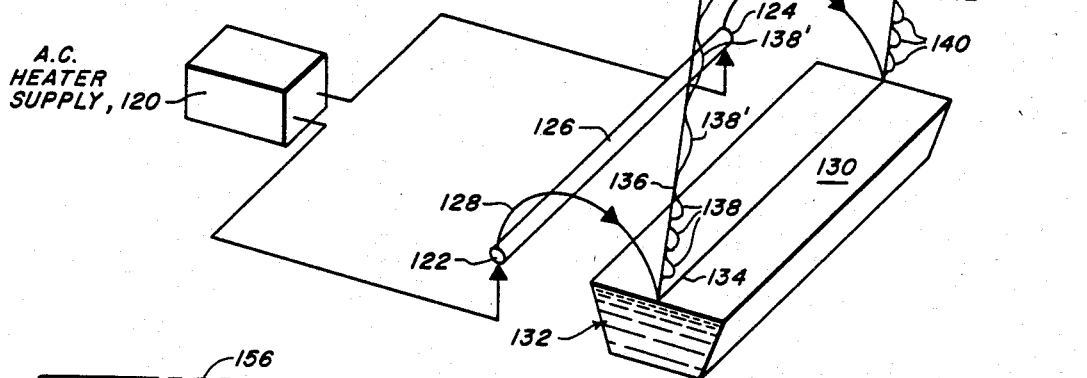
FIG. 5
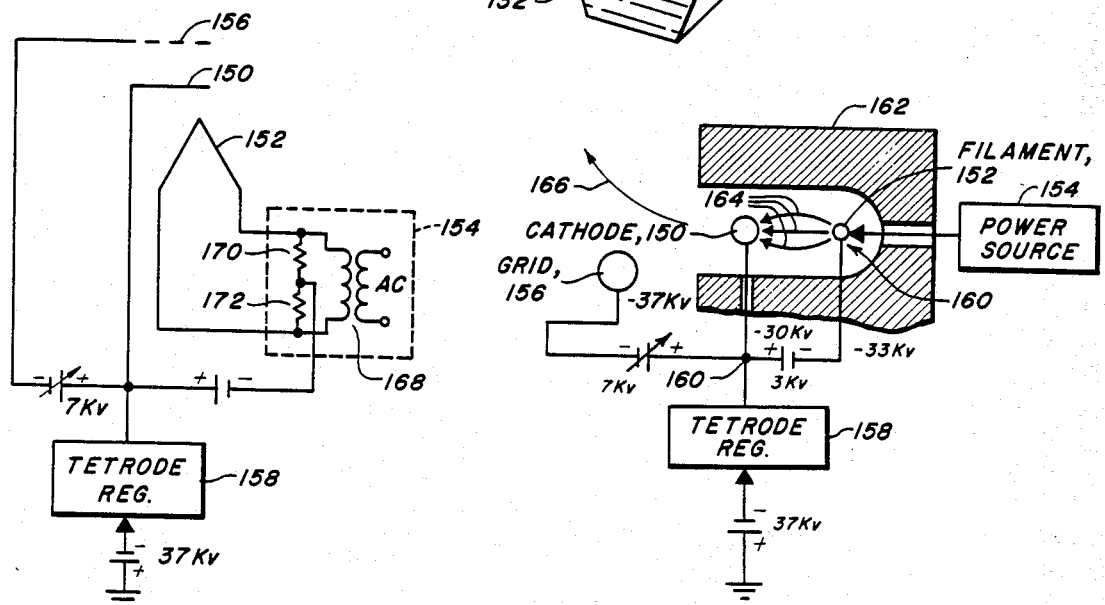
FIG. 7
FIG. 6

DEMODULATION OF VAPOR DENSITY

FIELD OF INVENTION

This invention relates to vaporization of a material through the utilization of electron beam bombardment and more particularly, to a method and apparatus for providing uniform vapor flux densities.

BACKGROUND OF THE INVENTION

Laser isotope separation using an electron beam evaporation source to provide atomic vapor requires vapor flux densities in the region of the extraction of the particular isotope to be temporally uniform. In general, when electron beams are utilized for bombarding a mass of material to vaporize it, fluctuations in the electron beam cause fluctuations in the vapor flux density and, in certain cases, may prevent reaching desired vapor density levels. Variation in vapor flux density results in decreased efficiency for systems, such as laser isotope separation systems, which require the continuous production of a vapor.

By way of background, electron beam evaporation sources have been used as a convenient means for evaporating high vapor temperature material such as uranium and other refractory metal elements. Such a technique has been found to be useful for the evaporation of uranium in high quantities for production level isotope separation as discussed in U.S. Pat. Nos. 3,772,519 and 3,944,825, both assigned to the assignee hereof. As used in such apparatus, it is preferable to employ a linear electron beam evaporation source such as described in U.S. Pat. Nos. 4,058,667 and 4,000,423, both assigned to the assignee hereof, to provide a long line source of uranium vapor for subsequent isotopically selective ionization and separation. Such a vapor source is also preferably operated at a high vaporization rate for increased enrichment efficiency. In order to achieve high efficiency at high vaporization rates, it is critical that the vapor flux density be as uniform as possible.

In electron beam evaporation sources utilizing an elongated linear filament, the above-mentioned vapor flux modulations are a function of the current utilized to heat the filament. Under ordinary circumstances, 60 Hz heater current is employed. As a result, the emission current caused by the flow of electrons from a filament to a melt of vapor-generating material modulates at 120 Hz with its minima corresponding to the heater current maxima and minima. This electron beam fluctuation is caused by "trapping" of electrons near the filament by the magnetic field produced by the heater current. That is, the Larmor force on the electrons from the magnetic field encircling the filament causes some of the electrons to be driven back toward the filament. Since the electrons are driven back to the filament on a periodic basis, the intensity of the electron beam fluctuates in a periodic fashion, which in turn results in the vapor density fluctuating in a like periodic fashion. When vapor flux density modulations are measured using the background ion current, vapor flux density modulations follow the emission current modulations. In prior art systems, vapor flux density modulations have been measured as high as 50% in uranium evaporators.

While it might be thought that the vapor flux modulation problem could be solved by the use of a d.c.-heated filament, analysis shows that the lifetimes of the a.c. heated filaments are at least an order of magnitude greater than the lifetimes of corresponding d.c.-driven filaments. The use of an a.c. filament drive is exceptionally important for the longevity of laser isotope separation systems in which high evaporation rates require the filaments to deliver as much as 34 amps of emission current per meter of elongated linear filament.

SUMMARY OF THE INVENTION

In order to compensate for the non-uniformities in vapor density caused by trapping of electrons near the filament due to the magnetic field produced by the alternating heater current, either out-of-phase modulation is applied to the grid which controls electron flow from the filament, a high frequency a.c. source is used for heating the filament, or an indirectly heated bombarded cathode is utilized in which the cathode is spaced from the heated filament so that its emission is not substantially affected by any magnetic field produced by the heater current. It is the goal of each of these techniques to reduce the amplitude of the vapor flux variations to less than 10% of the total flux amplitude.

In the first of the methods used to compensate for non-uniform vapor density, out-of-phase modulation is used to drive a grid, the voltage on which is used to control the flow of electrons from the filament to the material from which vapor is generated. When a grid is interposed between a filament and an anode containing the vapor generating material, usually a melt, the rate of electron flow and thus the rate of vaporization is controlled by the difference in the d.c. voltages applied to the filament and grid.

With filaments provided with 60Hz heater current, electron trapping modulates the electron flow at 120 Hz. Thus, electrons are trapped near the filament on a 120 Hz periodic basis. By applying an out-of-phase 120 Hz signal to the grid, electron flow from the filament is increased to exactly those times when the alternating magnetic field operates to trap electrons. By adjustment of the level of the out-of-phase signal, the electron flow may be increased at the appropriate times so as to exactly counteract the numbers of electrons which are trapped. Since grid control is required for other reasons, the grid voltage can thus be made to automatically compensate for the temporal characteristics of the electron source so as to provide a uniform electron beam. It should be noted that the grid modulation is to compensate for the maximum effect of electron trapping. For instance, with a limited controlled beam current of about 32 amperes per meter, the grid control voltage is made to swing from approximately 250 to 1,250 volts.

With the use of the grid, the evaporator can also be made to operate in a "space charge limited" mode as opposed to an "emission limited" mode in which the hotter the filament, the more electrons that are produced. In an emission limited mode, the evaporated material in the form of an ion cloud is usually accelerated towards the negatively charged filament which coats the filament and causes uncontrolled filament activation and thus uncontrolled emission increases. Such uncontrolled filament activation is greatly reduced when operating in a space charge limited mode due to the action of a grid.

As a second method of compensation, the frequency of the a.c. filament heater source is increased to a frequency above 3,500 Hz from its nominal 60 Hz frequency. It has been found that increasing the frequency of the filament heater supply results in a type of smoothing of the vapor density fluctuations. This latter technique is rendered possible due to the natural radial velocity distribution of the vapor. As was noted previously, electron beam fluctuation produces fluctuation of the rate at which particles are evaporated. This produces particle packets which travel outwardly from the line on the melt at which the electron beam impinges. These packets are highly defined and concentrated and result in marked variations in vapor density at a point above the melt as the vapor packets move away from the melt. Because of the natural radial velocity distribution, these rather highly defined packets of particles become less defined the further they move away from the melt. If it is considered that the particles are confined in particle distribution envelopes, as the particles move away from the melt, the particle distribution envelopes are spread or smeared out. When the frequency of the a.c. filament heater source is markedly increased, the smeared out particle distribution envelopes overlap. Because of the overlapping, the variation in density is markedly reduced. Thus, vapor density variations are virtually eliminated as the frequency of the a.c. heater source increases.

It should be noted that because of the radial velocity distribution, the amplitude of the vapor modulation is reduced as the distance from the source increases or as the radial Mach number decreases. For a predetermined design basis Mach number and radial distance from the vapor source, it has been found that above 3,500 Hz the modulations are less than the desired minimum amplitude of 10%. Near 5,000 Hz the modulations are less than 5%. With vapor modulations of less than 10%, the efficiency of the aforementioned isotope separation process increases dramatically.

While the above two methods circumvent the electron trapping problem, the third method of using an indirectly heated cathode actually substantially reduces the degree of electron trapping by removing the high amplitude a.c. heating currents from the electron source.

It has now been found that it is possible to design a cathode bombarded with electrons from a filament which is removed from the cathode a distance sufficient to prevent electrons emanating from the cathode from being affected by the alternating current passing through the filament. In one embodiment, the cathode is the same element as in the directly heated case, with the cathode being a tungsten rod requiring about 2 kw of power to maintain the proper emission temperature. Hidden behind the tungsten rod cathode is a smaller diameter filament which conventionally serves as the electron source. To obtain the 2 kw heating requirement of the cathode, the filament emits about 650 ma per half meter total to the cathode with an electron acceleration voltage of 3,000 volts.

BRIEF DESCRIPTION OF THE DRAWINGS

These and other features of the subject invention will be better understood in connection with the detailed description taken in conjunction with the drawings of which:

FIG. 4 is a schematic diagram illustrating a circuit for the production of out-of-phase grid modulation for increasing electron flow from the filament at times when the alternating magnetic field produced by a.c. filament current operates to trap electrons;

FIG. 5 is a diagrammatic illustration of the utilization of a high frequency a.c. power source for the filament utilized in vapor generation, illustrating the effect of increasing the filament drive frequency;

FIG. 6 is a diagrammatic illustration of the utilization of an auxiliary cathode heated by the bombardment of electrons from a filament spaced from the cathode by a distance which removes the cathode from the magnetic field produced by the a.c. heating of the filament; and, FIG. 7 is a schematic diagram of apparatus utilized for the driving of the filament in FIG. 6.

DETAILED DESCRIPTION

Figure 1:
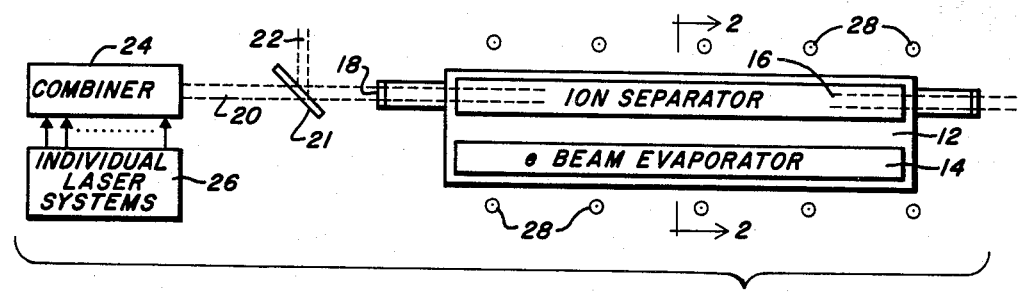
FIG. 1 is a schematic view of a portion of enrichment apparatus for which the present invention is particularly useful.
Figure 2:
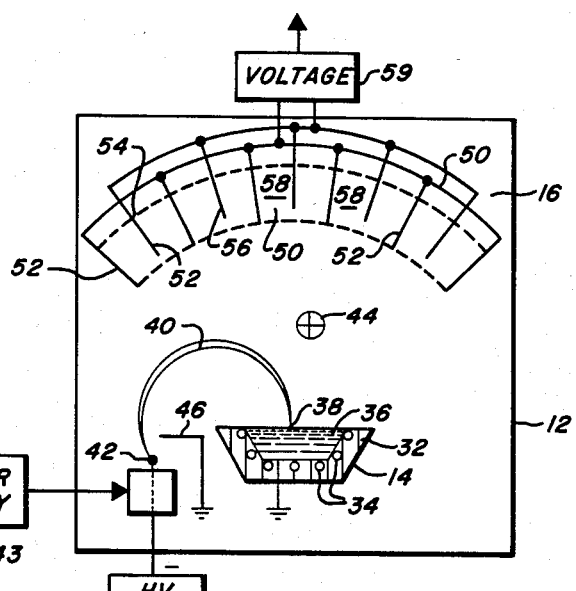
FIG. 2 is a schematic and sectional interior diagram of a portion of the apparatus of FIG. 1.

A prior art electron beam evaporation system is illustrated in FIGS. 1 and 2 in which an electron beam evaporator 12 is positioned adjacent an ion separator 16 so that vapor generated by the electron beam may be processed to separate various constituents, in the illustrated case, by isotopic separation techniques. While the subject invention will be described in connection with uranium laser enrichment, the provision of a temporally stable vapor density by the present invention may be utilized anywhere that such a temporally stable vapor is required.

Referring to FIG. 1, a general schematic diagram is illustrated for a uranium enrichment system utilizing evaporation apparatus of the present invention. As shown, a chamber 12 is provided for separating the uranium isotopes in the flowing uranium vapor produced by electron beam evaporator 14. The separation is produced within ion separator 16 to which laser radiation in a beam 18 is applied to produce isotopically selective photoexcitation of one isotope in the vapor. Laser beam 18 is produced as a composite beam from plural laser beams 20 and 22, which beams are combined by a dichroic mirror 21. Typically, each beam consists of a series of high repetition rate pulses, typically up to 50,000 pulses per second of finely tuned photon energy to produce isotopic selectivity in the absorption by the uranium vapor particles. The pulse repetition rate in beam 20 is such as to permit elimination of all desired particles in the vapor from vapor source 14 over the transverse dimension of beam 18 in the direction of vapor flow. In providing such a pulse repetition rate, it is possible to combine by a combiner 24 the laser pulses from a plurality of separate radiation sources 26 by providing rotating optical elements in the combiner such as a rotating rhomboid having parallel reflecting surfaces rotated to receive each of the beams on one surface as the pulse in each beam occurs, and to reflect it towards the other surface for reflection into a single beam path of augmented pulse rate.

The excited vapor particles within the ion separator are subsequently ionized by a laser or electron impact techniques to produce a concentration of ionized particles of one isotope type which may then be conveniently accelerated onto separate collection surfaces by interaction of a magnetic field from coils 28 and an electric field from voltage applied to plates within ion separator 16 subsequent to each pulse of laser radiation.

Details of the electron beam evaporator source 14 of FIG. 1 are illustrated in FIG. 2. Vapor source 14 is illustrated as including a copper crucible 32 having a plurality of cooling ports 34 for water and containing a mass 36 of uranium which is liquified and vaporized in a region surrounding a point of impact 38 for an electron beam 40 along the surface of mass 36. Typically, the point of impact is a line extending most of the entire length of the surface of the uranium mass. Electron beam 40 originates from a long filament 42 heated by a supply 43 and is focused by magnetic field 44 generated by coils 28 of FIG. 1. The electron beam 40 is additionally electrostatically guided by a grounded plate 46 which is connected to ground along with crucible 32.

Ion separator 16 into which the uranium vapor flows in a radial expansion comprises an arcuate conductive plate 50 formed as a cylindrical section which has electrically conducting plates 52 radially extending towards line source 38 at a distance to define chambers 54. Chambers 54 contain an interior electrode 56 which extends the length of the chamber. The laser radiation of beam 18 is applied within chambers 54 and regions 58 bounded by the dash lines. The ionized particles created in the vapor in chambers 54 by photoexcitation and ionization are accelerated onto one side of plates 52 by electromagnetic forces created by the cooperation of magnetic field 44, typically 150 gauss, with an electric field applied by a source 59 between plates 52 and 56 typically at a 60 volt potential.

Filament 42 is energized by a high voltage supply 60 as illustrated and in this case is provided typically with a 30 kv potential which is negative with respect to ground.

Figure 3:
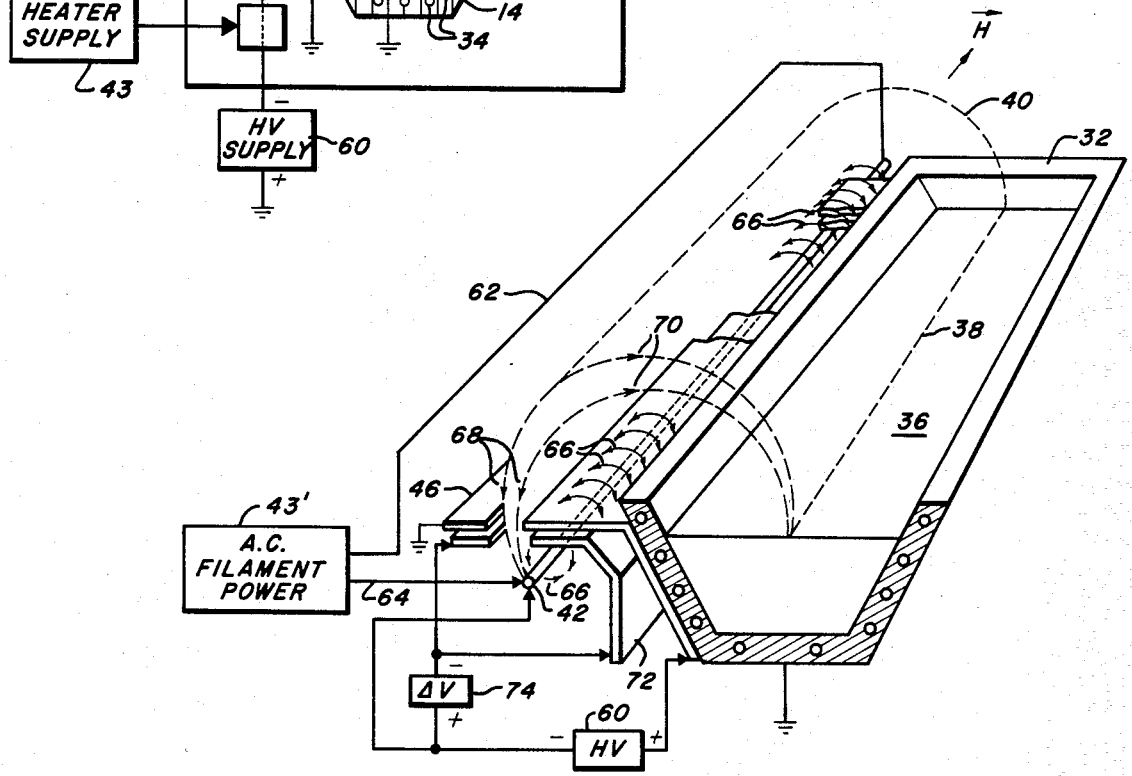
FIG. 3 is a diagrammatic illustration of the effect of the utilization of an a.c. driven filament on the electron beam utilized for the production of vapor, illustrating the effect of electron trapping.

As illustrated in FIG. 3, heater supply 43, in general, is an a.c. filament power source 43' which applies typically a 60 cycle signal over lines 62 and 64 to the ends of filament 42. By virtue of the oscillating current through the filament, an oscillating magnetic field is set up adjacent the filament. This produces an oscillating magnetic field as illustrated by double-ended arrow 66 which is perpendicular to the field 44 of FIG. 2. The result is the forcing of the electrons from the filament back towards the filament as illustrated by arrow 68. The oscillating magnetic field thus forces the electrons towards the filament instead of allowing them to travel path 40 in the direction of arrow 70 towards surface 36 of the melt.

The result is that the intensity of electron beam 40 oscillates typically at twice the frequency of a.c. source 43', which in turn results in periodic variations in the intensity of the vapor evolved from the surface of the melt. Thus what is produced is a temporally varying vapor which significantly decreases the efficiency of the ion separation process.

Prior to describing various techniques for demodulation of the vapor density, the operation of the system of FIG. 3 in a space charge limited mode is described. In order to limit the electron flow, a grid 72 is disposed between the filament and the crucible, and a d.c. control voltage $\Delta V$ more negative than the d.c. voltage 60 is applied to the grid, with the magnitude of $\Delta V$ controlling electron flow.

DEMODULATION OF VAPOR DENSITY

One method for the demodulation of vapor density involves providing out-of-phase modulation to drive grid 72 which is used to control the flow of the electron beam from the filament to the melt. Since the vapor flux modulations follow the electron beam fluctuations, and since the electron beam fluctuations occur at twice the frequency of the a.c. filament supply, the modulation applied to the grid is twice the frequency of the filament supply and is out-of-phase with the periodic fluctuations in the electron beam such that as electrons come off the filament, they are accelerated at exactly the time when the magnetic field surrounding the filament would ordinarily trap the electrons.

In order to accomplish this and referring now to FIG. 4, the output of an a.c. filament supply 80 is coupled via transformer 82 to what is usually called a "hot deck", and thence to a filament 84, with the a.c. power being supplied at nodes 86 and 88. A grid diagrammatically illustrated at 90 is interposed between filament 84 and a crucible diagrammatically illustrated at 92 which, as illustrated, is grounded. Power for grid 90 is provided by an E-beam gun grid d.c. power supply 94 in the form of a full wave rectifier. The output voltage of supply 94 is controlled via an a.c. controller 96 which is provided with a.c. power, with the output of the controller being applied to the power supply 94 through a transformer 98. As will be discussed, the d.c. output of supply 94 is controlled to provide a preselected beam current such that if the beam current increases, the d.c. voltage is increased to decrease the electron flow, thereby to establish a regulated space charge limited mode of operation.

Filament 84 is coupled to a $-30$ kv HV supply 100 via line 102 which passes through a beam current monitor toroid 104 which is coupled to a control circuit 106. The torroid detects beam current, with circuit 106 providing an output signal proportional to the error between the detected beam current and the preselected beam current. This error signal is used to vary the duty cycle of the a.c. power to supply 94 and thereby adjust the output voltage of supply 94.

The $-30$ kv from HV supply 100 is coupled to filament 84 through resistors R1 and R2 which function as electron beam current sense resistors. The current through resistors R1 and R2 varies with variations in the electron beam from the filament to the crucible. The electron flow is naturally modulated by electron trapping at twice the frequency of the a.c. filament drive. This periodic fluctuation is sensed at resistors R1 and R2 and is reflected by the voltage at nodes 86 and 88, sensed at node 89 which is the midpoint between resistors 91 and 93 coupled across nodes 86 and 88.

A modulator and phase shift amplifier 110 is coupled to nodes 86 and 88 via node 89 which produces an amplified phase-shifted signal to the power supply 94. The output of supply 94 is thus its original adjusted d.c. voltage on which an out-of-phase modulation is impressed. Thus, supply 94 acts in the nature of a battery connected in series with an a.c. source, e.g. the output of amplifier 110.

Thus, the E-beam gun grid d.c. power supply can be used effectively not only to supply power to the grid, but also to modulate the grid voltage at the appropriate phase and amplitude so as to accelerate electrons away from the filament at exactly the time at which the electrons are being accelerated back towards the filament by virtue of the magnetic field produced by the current through the filament.

An alternative technique to that described in connection with FIG. 4 is a technique in which the frequency of the filament supply is increased dramatically. This system is illustrated in FIG. 5 in which an a.c. filament supply 120 is coupled to either end 122 and 124 of a filament 126. As described hereinbefore, with appropriate d.c. biasing of the filament and the crucible, the electrons from the filament execute an arc such as illustrated at 128 due to a superimposed magnetic field (not shown) and impinge upon the surface 130 of a melt 132 to be vaporized, with the electron beam impinging on surface 130 along a line 134.

The result along a radial path 136 is a number of particle packets which travel outwardly along radius 136. These packets may be illustrated by particle distribution envelopes 138. The frequency with which the particle distribution envelopes are produced in twice the filament current frequency, e.g. $F_1 = 120$ Hz. As the packets of particles travel along radius 136, the particle distribution envelopes are smeared out as illustrated at 138' due to the radial velocity distribution mentioned hereinbefore. These particle distribution envelopes result in significant variations in vapor density.

If the frequency of supply 120 is increased such that $F_2$ is greater than $F_1$, the resulting particle distribution envelopes 140 are more closely spaced together. The result, due to the radial velocity distribution along a radius 142, is substantial overlap of particle distribution envelopes 140'. Thus the affect of dramatically increasing the frequency of the filament supply is such as to cause a substantial overlap at a distance from line 134, thereby effectively removing modulations in vapor density such as those illustrated at 138'.

It will therefore be appreciated that the natural radial velocity distribution of the vapor reduces the amplitude of the vapor modulations as the distance from the source increases, as the frequency of the modulations increase or as the Mach number decreases. It will be further appreciated that the higher the Mach number, the higher the percentage of vapor flux modulation. Moreover, the higher the frequency, the lower will be the vapor flux modulation percentage. For a radial Mach number being the same as the measured azimuthal Mach number, it has been found that above 3500 Hz the modulations are less than the desired minimum amplitude of 10%. Near 5000 Hz the modulations are less than 5%. The above measurements were taken in uranium vapor at 78 cm above the melt. Since the modulations decrease with increasing distance for a design value of 100 cm, clearly less than 10% vapor modulation exists at filament drive frequencies exceeding 3500 Hz.

As illustrated, vapor modulation is reduced without the use of a grid or the requirement of operation in a space charge limited mode. However, improved operation can be obtained through the use of a grid and space charge limited operation. While the systems of FIGS. 4 and 5 circumvent the electron trapping problem, a third alternative, substantially reduces the degree of electron trapping by removing the high amplitude heating currents from the electron source. This is accomplished by using a auxiliary cathode heated by the bombardment of electrons from a filament spaced from the cathode by a distance which removes the cathode from the magnetic field produced by the a.c. heating of the filament.

As illustrated in FIG. 6, a bombarded cathode 150 accomplishes the same reduction in electron trapping as in the first two embodiments. It should be noted that the cathode is the same element as in the directly heated case, and that in one embodiment this cathode is a 0.060 inch diameter tungsten rod requiring about 2 kw of power to maintain the proper emission temperature. Hidden behind the tungsten cathode is a smaller diameter filament 152, which in one embodiment has a diameter of 0.040 inches. It should be noted that the filaments of this diameter have been used in the past as electron sources. To obtain the 2 kw heating requirement for the cathode, the filament, in a temperature limited mode so as not to make dimensional spacings critical, emits about 650 miliamperes total to the cathode. In one embodiment, an electron acceleration of 3000 volts (3 kv) is used. This requires a heater current of approximately 42 amperes and a filament voltage of approximately 18 volts which is supplied via a source 154.

In one embodiment, cathode 150 is operated in a space charge limited emission mode by virtue of utilization of grid 156. This provides both protection against unwanted cathode activation and nullifies the effect of minor variations in the diameters of either the cathode or the filament elements on the electron beam emitted from the cathode.

It has been observed many times in the past that when gun diodes, e.g. guns having two elements, are used in a non-space charge emission limited mode, the cathode can become coated with ions from the melt. In the case of uranium, the ion cloud is accelerated towards the negative cathode and produces non-uniform cathode activation in which emission increases in an uncontrolled manner. When the cathodes become activated, heating currents drop in peak amplitude to almost half in obtaining the desired emission current. However because of the nonuniform coating, the heating current is reduced in an uncontrolled manner. By using a third element, e.g. a grid, which is made more negative than the cathode, the gun cannot only be operated in a space charge limited mode, but is also operated so that the grid is coated with the ions as opposed to the cathode. Thus random activation is avoided.

In one embodiment, 37 kv is applied to a tetrode regulator 158 which supplies a regulated $-30$ kv to node 160. This node is coupled to cathode 150 as illustrated. A d.c. source represented by the 3 kv battery is responsible for applying $-33$ kv to filament 152. The $-33$ kv is also applied to a cavity generally illustrated at 160 within a conductive metal housing 162. It will be appreciated that cathode 150 and filament 152 are mounted within cavity 160 and that because of the positive voltage differential between the filament and the cathode, electrons from the filament are directed towards the cathode as illustrated by arrows 164. While the electrons boil off the filament in all directions, the $-33$ kv on the cavity walls is responsible for directing the electrons towards the cathode. such that nearly all of the electrons emitted from the filament impinge upon the cathode. Grid 156 is supplied with a variable voltage from a 0–7 kv voltage source such that in one embodiment, the maximum voltage on grid 156 is $-37$ kv. This provides for the space charge limited operation of cathode 150, with the cathode emission being that illustrated by arrow 166.

Referring to FIG. 7, a schematic diagram of the apparatus of FIG. 6 is illustrated. As can be seen, a.c. source 154 includes a transformer 168, the output of which is applied across filament 152. The acceleration voltage of $-33$ kv is applied to filament 152 via resistors 170 and 172 coupled in series across filament 152, the $-37$ kv being applied to the junction between the two resistors. It will be appreciated that cathode 150 is maintained a sufficient distance from filament 152 such that the emission therefrom is virtually unaffected by a.c. filament currents should an a.c. source be utilized.

In all of the above embodiments what has been provided is a stream of electrons which impinge on a melt in which steps have been taken to minimize resulting vapor flux density variations due to electron trapping. In the first system, the effects of electron beam trapping are reduced by virtue of an out-of-phase grid modulation of an appropriate amplitude. In the next alternative, the frequency of the a.c. filament supply is increased so as to take advantage of the radial velocity distribution in damping out vapor density variations. In the third alternative, a bombarded cathode is utilized which is spaced from the filament by an amount so as to insure that the effect on cathode emission due to a.c. filament currents is negligible.

Having above indicated a preferred embodiment of the present invention, it will occur to those skilled in the art that modifications and alternatives can be practiced within the spirit of the invention. Moreover, it should be noted that a combination of these approaches may be utilized in obtaining the desired results. It is accordingly intended to define the scope of the invention only as indicated in the following claims.

What is claimed is:
1. An electron beam evaporation system comprising:
    a vapor source including an electrically conductive crucible;
    a source of electrons including a filament, means for applying alternating heater current to said filament, means for focusing electrons from said filament to said crucible, means for applying a d.c. voltage to said filament such that a voltage differential is established between said filament and said crucible; and,
    means for reducing non-uniformities in vapor density caused by periodic trapping of electrons near said filament due to the alternating magnetic field produced by said alternating heater current.
2. The system of claim 1 and further including means for assuring that said source operates in a space charge limited mode.
3. The system of claim 2 wherein said means for assuring that said source operates in a space charge limited mode includes a grid positioned between said filament and said crucible.
4. The system of claim 3 and further including means for biasing said grid with a d.c. voltage which is more negative than the d.c. voltage applied to said filament, thereby to permit operation in a space charge limited mode.
5. The system of claim 3 wherein said non-uniformity reducing means includes means for applying out-of-phase modulation to said grid.
6. The system of claim 5 wherein said out-of-phase modulation applying means includes means for generating said modulation so as to increase electron flow from said filament at times when said alternating magnetic field operates to trap electrons.
7. The system of claim 1 wherein said non-uniformity reducing means includes means for controlling said alternating heater current applying means to provide current at a frequency above 60 Hz.
8. The system of claim 7 wherein said frequency exceeds 3,500 Hz.
9. The system of claim 1 wherein said non-uniformity reducing means includes a cathode spaced from said filament, said cathode being positioned between said filament and said crucible, and means for biasing said cathode with a d.c. voltage which is less negative than the d.c. voltage applied to said filament.
10. The system fo claim 8 and further including a grid between said cathode and said crucible and means for biasing said grid with a d.c. voltage which is more negative than the d.c. voltage applied to said filament, thereby to permit operation in a space charge limited mode.
11. The system of claim 9 and further including an electrically conductive housing having a cavity opened at one side of said housing, said filament and said cathode being located within said cavity with said cathode positioned closer to the portion of said cavity opened at said one side of said housing than said filament.
12. The system of claim 11 and further including means for biasing said housing at the same d.c. voltage as said filament.

* * * * *